United States Patent
McHugh et al.

(10) Patent No.: US 12,489,417 B2
(45) Date of Patent: Dec. 2, 2025

(54) LADDER FILTER WITH TRANSVERSELY-EXCITED FILM BULK ACOUSTIC RESONATORS HAVING DIFFERENT PITCHES

(71) Applicant: Murata Manufacturing Co., Ltd., Nagaokakyo (JP)

(72) Inventors: Sean McHugh, Santa Barbara, CA (US); Greg Dyer, Santa Barbara, CA (US); Bryant Garcia, Mississaugna (CA)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 335 days.

(21) Appl. No.: 18/194,012

(22) Filed: Mar. 31, 2023

(65) Prior Publication Data
US 2023/0327644 A1 Oct. 12, 2023

Related U.S. Application Data

(60) Provisional application No. 63/330,275, filed on Apr. 12, 2022.

(51) Int. Cl.
*H03H 9/13* (2006.01)
*H03H 9/02* (2006.01)
(Continued)

(52) U.S. Cl.
CPC ........ *H03H 9/132* (2013.01); *H03H 9/02228* (2013.01); *H03H 9/205* (2013.01); *H03H 9/568* (2013.01)

(58) Field of Classification Search
CPC .... H03H 9/132; H03H 9/02047; H03H 9/205; H03H 9/568; H03H 2003/023; H03H 9/02062; H03H 9/174; H03H 9/02228
(Continued)

(56) References Cited

U.S. PATENT DOCUMENTS 5,705,399 A  1/1998 Larue
5,853,601 A  12/1998 Krishaswamy et al.
(Continued)

FOREIGN PATENT DOCUMENTS

WO  2016017104  2/2016
WO  2018003273 A1  1/2018

OTHER PUBLICATIONS

T. Takai, H. Iwamoto, et al., "I.H.P.Saw Technology and its Application to Microacoustic Components (Invited)." 2017 IEEE International Ultrasonics Symposium, Sep. 6-9, 2017. pp. 1-8.
(Continued)

*Primary Examiner* — Andrea Lindgren Baltzell
*Assistant Examiner* — Victor Cole
(74) *Attorney, Agent, or Firm* — ArentFox Schiff LLP

(57) ABSTRACT

A filter device is provided that includes a substrate having a surface and a piezoelectric plate supported by the substrate. A plurality of interdigital transducers (IDTs) for multiple resonators are provided that each have interleaved fingers at respective diaphragms of the piezoelectric plate disposed over one or more cavities. Moreover, a first resonator includes a first plurality of interleaved fingers having a first pitch and a second resonator includes a second plurality of interleaved fingers having a second pitch that is different than the first pitch. This configuration adjusts the resonance frequencies of each resonator. Moreover, a dielectric layer may be uniformly disposed over at least one surface of the respective diaphragms of the piezoelectric plate.

16 Claims, 11 Drawing Sheets

(51) Int. Cl.
　　　*H03H 9/205*　　(2006.01)
　　　*H03H 9/56*　　(2006.01)
(58) Field of Classification Search
　　　USPC .................................................. 333/188, 196
　　　See application file for complete search history.

(56) References Cited

U.S. PATENT DOCUMENTS

| | | | |
|---|---|---|---|
| 6,540,827 | B1 | 4/2003 | Levy et al. |
| 6,707,229 | B1 | 3/2004 | Martin |
| 7,463,118 | B2 | 12/2008 | Jacobsen |
| 7,535,152 | B2 | 5/2009 | Ogami et al. |
| 7,684,109 | B2 | 3/2010 | Godshalk et al. |
| 7,802,466 | B2 | 9/2010 | Whalen et al. |
| 7,868,519 | B2 | 1/2011 | Umeda |
| 8,278,802 | B1 | 10/2012 | Lee et al. |
| 8,344,815 | B2 | 1/2013 | Yamanaka |
| 8,829,766 | B2 | 9/2014 | Milyutin et al. |
| 8,932,686 | B2 | 1/2015 | Hayakawa et al. |
| 9,130,145 | B2 | 9/2015 | Martin et al. |
| 9,219,466 | B2 | 12/2015 | Meltaus et al. |
| 9,276,557 | B1 | 3/2016 | Nordquist et al. |
| 9,369,105 | B1 | 6/2016 | Li |
| 9,425,765 | B2 | 8/2016 | Rinaldi |
| 9,525,398 | B1 | 12/2016 | Olsson |
| 9,748,923 | B2 | 8/2017 | Kando et al. |
| 9,780,759 | B2 | 10/2017 | Kimura et al. |
| 10,200,013 | B2 | 2/2019 | Bower et al. |
| 10,491,192 | B1 | 11/2019 | Plesski et al. |
| 10,601,392 | B2 | 3/2020 | Plesski et al. |
| 10,637,438 | B2 | 4/2020 | Garcia et al. |
| 10,756,697 | B2 | 8/2020 | Plesski et al. |
| 10,790,802 | B2 | 9/2020 | Yantchev et al. |
| 10,797,675 | B2 | 10/2020 | Plesski |
| 10,826,462 | B2 | 11/2020 | Plesski et al. |
| 2002/0079986 | A1 | 6/2002 | Ruby et al. |
| 2002/0158714 | A1 | 10/2002 | Kaitila et al. |
| 2003/0199105 | A1 | 10/2003 | Kub et al. |
| 2004/0090145 | A1 | 5/2004 | Bauer et al. |
| 2004/0261250 | A1 | 12/2004 | Kadota et al. |
| 2006/0125489 | A1 | 6/2006 | Feucht et al. |
| 2006/0222568 | A1 | 10/2006 | Wang et al. |
| 2007/0194863 | A1 | 8/2007 | Shibata et al. |
| 2010/0064492 | A1 | 3/2010 | Tanaka |
| 2010/0123367 | A1 | 5/2010 | Tai et al. |
| 2011/0109196 | A1 | 5/2011 | Goto |
| 2011/0278993 | A1 | 11/2011 | Iwamoto |
| 2013/0015353 | A1 | 1/2013 | Tai et al. |
| 2013/0234805 | A1 | 9/2013 | Takahashi |
| 2013/0321100 | A1 | 12/2013 | Wang |
| 2014/0145556 | A1 | 5/2014 | Kadota |
| 2014/0151151 | A1 | 6/2014 | Reinhardt |
| 2014/0152145 | A1 | 6/2014 | Kando et al. |
| 2014/0173862 | A1 | 6/2014 | Kando et al. |
| 2014/0225684 | A1 | 8/2014 | Kando et al. |
| 2015/0319537 | A1 | 11/2015 | Perois et al. |
| 2015/0333730 | A1 | 11/2015 | Meltaus |
| 2016/0028367 | A1 | 1/2016 | Shealy |
| 2016/0182009 | A1 | 6/2016 | Bhattacharjee |
| 2017/0063332 | A1 | 3/2017 | Gilbert et al. |
| 2017/0179928 | A1 | 6/2017 | Raihn et al. |
| 2017/0214387 | A1 | 7/2017 | Burak et al. |
| 2017/0222622 | A1 | 8/2017 | Solal et al. |
| 2017/0370791 | A1 | 12/2017 | Nakamura et al. |
| 2018/0123016 | A1 | 5/2018 | Gong et al. |
| 2018/0191322 | A1 | 7/2018 | Chang et al. |
| 2019/0068164 | A1 | 2/2019 | Houlden et al. |
| 2019/0131953 | A1 | 5/2019 | Gong |
| 2019/0273480 | A1 | 9/2019 | Lin |
| 2020/0373907 | A1 | 11/2020 | Garcia |
| 2021/0067138 | A1* | 3/2021 | Yantchev ........... H03H 9/14582 |

OTHER PUBLICATIONS

R. Olsson III, K. Hattar et al. "A high electromechanical coupling coefficient SH0 Lamb wave lithiumniobate micromechanical resonator and a method for fabrication" Sensors and Actuators A: Physical, vol. 209, Mar. 1, 2014, pp. 183-190.

M. Kadota, S. Tanaka, "Wideband acoustic wave resonators composed of hetero acoustic layer structure," Japanese Journal of Applied Physics, vol. 57, No. 7S1. Published Jun. 5, 2018. 5 pages.

Y. Yang, R. Lu et al. "Towards Ka Band Acoustics: Lithium Niobat Asymmetrical Mode Piezoelectric MEMS Resonators", Department of Electrical and Computer Engineering University of Illinois at Urbana-Champaign, May 2018. pp. 1-2.

Y. Yang, A. Gao et al. "5 Ghz Lithium Niobate MEMS Resonators With High FOM of 153", 2017 IEEE 30th International Conference in Micro Electro Mechanical Systems (MEMS). Jan. 22-26, 2017. pp. 942-945.

USPTO/ISA, International Search Report and Written Opinion for PCT Application No. PCT/US2019/036433 dated Aug. 29, 2019.

USPTO/ISA, International Search Report and Written Opinion for PCT Application No. PCT/US2019/058632 dated Jan. 17, 2020.

G. Manohar, "Investigation of Various Surface Acoustic Wave Design Configurations for Improved Sensitivity." Doctoral dissertation, University of South Florida, USA, Jan. 2012, 7 pages.

Ekeom, D. & Dubus, Bertrand & Volatier, A . . . (2006). Solidly mounted resonator (SMR) FEM-BEM simulation. 1474-1477. 10.1109/ULTSYM.2006.371.

Mizutaui, K. and Toda, K., "Analysis of lamb wave propagation characteristics in rotated Y-cut X-propagation LiNbO3 plates." Electron. Comm. Jpn. Pt. I, 69, No. 4 (1986): 47-55. doi:10.1002/ecja.4410690406.

Naumenko et al., "Optimal orientations of Lithium Niobate for resonator SAW filters", 2003 IEEE Ultrasonics Symposium—pp. 2110-2113. (Year: 2003).

Webster Dictionary Meaning of "diaphragm" Merriam Webster since 1828.

Safari et al. "Piezoelectric for Transducer Applications" published by Elsevier Science Ltd., pp. 4 (Year: 2000).

Moussa et al. Review on Triggered Liposomal Drug Delivery with a Focus on Ultrasound 2015, Bentham Science Publishers, pp. 16 (Year 2005).

"Acoustic Properties of Solids" ONDA Corporation, 592 Weddell Drive, Sunnyvale, CA 94089, Apr. 11, 2003, pp. 5 (Year 2003).

Bahreynl, B., "Fabrication and Design of Resonant Microdevices" Andrew William, Inc. 2018, NY (Year 2008).

Material Properties of Tibtech Innovations, @ 2018 Tibtech Innovations (Year 2018).

Bousquet, Marie e al. "Single-mode high frequency LiNbO3 Film Bulk Acoustic Resonator," 2019 IEEE International Ultrasonics Symposium (IUS), Glasgow, Scotland, Oct. 6-9, 2019, pp. 84-87.

Wikipedia contributors, "Quartz crystal microbalance," Wikipedia, The Free Encyclopedia, https://en.wikipedia.org/w/index.php?title=Quartz_crystal_microbalance&oldid=1009990186 (accessed Apr. 9, 2021).

Yantchev, Ventsislav & Katardjiev, Ilia. (2013). Thin film Lamb wave resonators in frequency control and sensing applications: A review. Journal of Micromechanics and Microengineering. 23. 043001. 10.1088/0960-1317/23/4/043001.

Wei Pang et al. "Analytical and experimental study on the second harmonic mode response of a bulk acoustic wave resonator" 2010 J. Micromech. Microeng. 20 115015; doi:10.1088/0960-1317/20/11/115015.

Durmus et al. "Acoustic-Based Biosensors" Encyclopedia of Microfluidics and Nanofluidics. DOI 10.1007/978-3-642-27758-0_10-2 Springer Science+Business Media New York 2014.

* cited by examiner

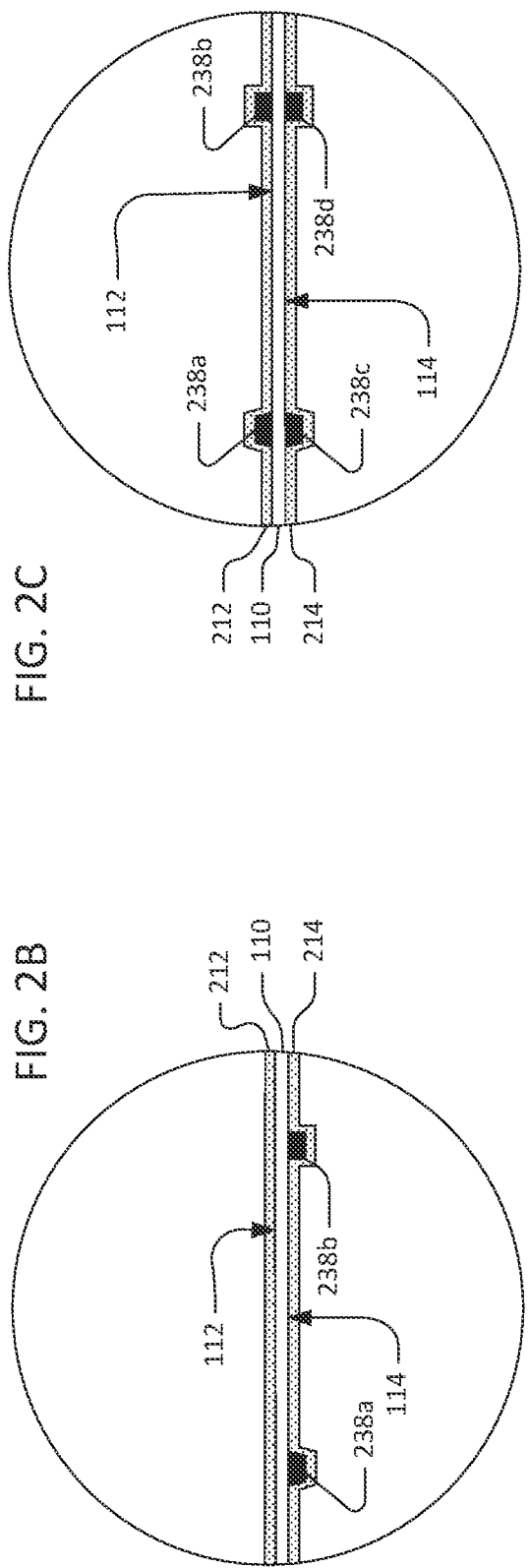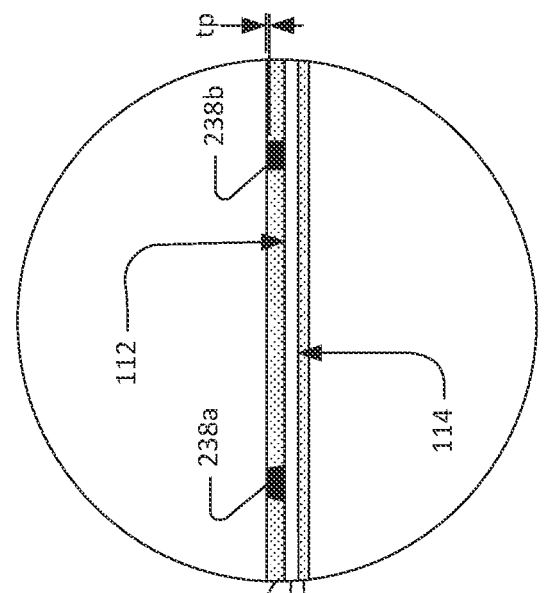

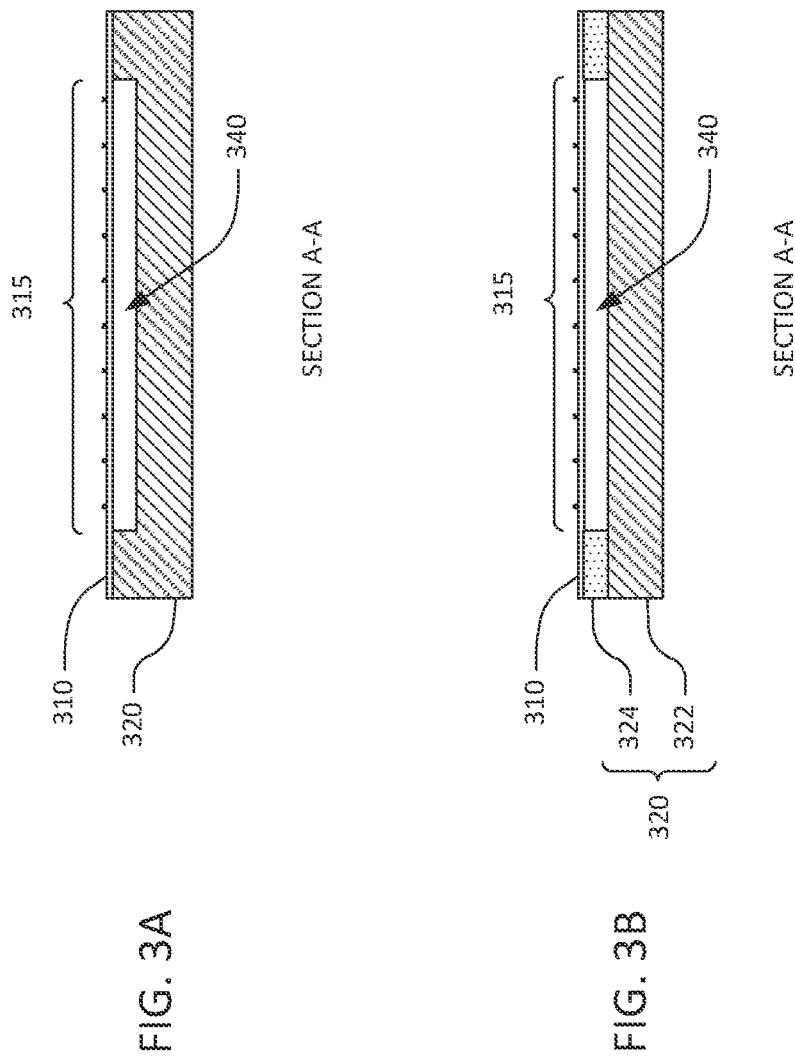

LADDER FILTER WITH TRANSVERSELY-EXCITED FILM BULK ACOUSTIC RESONATORS HAVING DIFFERENT PITCHES

CROSS REFERENCE TO RELATED APPLICATIONS

The current application claims priority to U.S. Patent Provisional Application No. 63/330,275, filed Apr. 12, 2022, the entire contents of which is hereby incorporated by reference.

TECHNICAL FIELD

This disclosure relates to radio frequency filters using acoustic wave resonators, and specifically to filters for use in communications equipment.

BACKGROUND

A radio frequency (RF) filter is a two-port device configured to pass some frequencies and to stop other frequencies, where "pass" means transmit with relatively low signal loss and "stop" means block or substantially attenuate. The range of frequencies passed by a filter is referred to as the "pass-band" of the filter. The range of frequencies stopped by such a filter is referred to as the "stop-band" of the filter. A typical RF filter has at least one pass-band and at least one stop-band. Specific requirements on a pass-band or stop-band may depend on the specific application. For example, in some cases a "pass-band" may be defined as a frequency range where the insertion loss of a filter is better than a defined value such as 1 dB, 2 dB, or 3 dB, while a "stop-band" may be defined as a frequency range where the rejection of a filter is greater than a defined value such as 20 dB, 30 dB, 40 dB, or greater depending on application.

RF filters are used in communications systems where information is transmitted over wireless links. For example, RF filters may be found in the RF front-ends of cellular base stations, mobile telephone and computing devices, satellite transceivers and ground stations, IoT (Internet of Things) devices, laptop computers and tablets, fixed point radio links, and other communications systems. RF filters are also used in radar and electronic and information warfare systems.

Performance enhancements to the RF filters in a wireless system can have broad impact to system performance. Improvements in RF filters can be leveraged to provide system performance improvements such as larger cell size, longer battery life, higher data rates, greater network capacity, lower cost, enhanced security, higher reliability, etc. These improvements can be realized at many levels of the wireless system both separately and in combination, for example at the RF module, RF transceiver, mobile or fixed sub-system, or network levels. As the demand for RF filters operating at higher frequencies continues to increase, there is a need for improved filters that can operate at different frequency bands while also improving the manufacturing processes for making such filters.

SUMMARY

Thus, according to an exemplary aspect, a filter device is provided that includes a substrate having a surface; at least one piezoelectric plate supported by the substrate; and a plurality of interdigital transducers (IDTs) of a plurality of resonators that each have a plurality of interleaved fingers at respective diaphragms of the at least one piezoelectric plate disposed over one or more cavities. In the exemplary aspect, a first resonator of the plurality of resonators includes a first plurality of interleaved fingers having a first pitch, and a second resonator of the plurality of resonators includes a second plurality of interleaved fingers having a second pitch that is different than the first pitch.

In another exemplary aspect, the first pitch is less than the second pitch, such that the first resonator has a higher resonance frequency than the second resonator.

In another exemplary aspect, the first resonator and the second resonator comprise a series resonator and a shunt resonator, respectively. Moreover, the filter device can include at least one dielectric layer that uniformly coats at least one surface of the respective diaphragms of the at least one piezoelectric plate of each of the series resonator and shunt resonator.

In another exemplary aspect, the respective IDTs of the first resonator and the second resonator are configured to excite shear bulk acoustic waves in the at least one piezoelectric plate in response to respective radio frequency signals applied to each IDT. Moreover, in a refinement of this aspect, the plurality of IDTs are on a first surface of each of the respective diaphragms and the at least one dielectric layer is between the plurality of IDTs.

In another exemplary aspect, the filter device includes a passivation layer directly on the plurality of IDTs of a plurality of resonators.

In another exemplary aspect, the first pitch is a first center-to-center spacing between adjacent interleaved fingers of the first plurality of interleaved fingers, and the second pitch is a second center-to-center spacing between adjacent interleaved fingers of the second plurality of interleaved fingers. Moreover, the first center-to-center spacing can be constant over a length of the respective IDT of the first resonator and the second center-to-center spacing varies constant over a length of the respective IDT of the second resonator. Alternatively, the first center-to-center spacing varies over a length of the respective IDT of the first resonator.

In another exemplary aspect, the plurality of IDTs of the plurality of resonators face the one or more cavities, respectively, which extend into the surface of the substrate. Moreover, the substrate can include a base and an intermediate layer that is a dielectric material and the one or more cavities extend into the intermediate layer.

In another exemplary aspect, the plurality of IDTs are on a first surface of each of the respective diaphragms that faces the substrate and at least one uniform dielectric layer is on a second surface of each of the respective diaphragms that is opposite the first surface.

In yet another exemplary aspect, a filter device is provided that includes a substrate having a surface; at least one piezoelectric plate supported by the substrate; and a plurality of interdigital transducers (IDTs) of a plurality of resonators, which include a series resonator and a shunt resonator, with the plurality of IDTs each having a plurality of interleaved fingers at respective diaphragms of the at least one piezoelectric plate disposed over one or more cavities. In this aspect, the series resonator includes a first plurality of interleaved fingers having a first pitch that is a first center-to-center spacing between adjacent interleaved fingers of the first plurality of interleaved fingers, and the shunt resonator includes a second plurality of interleaved fingers having a second pitch that is a second center-to-center spacing between adjacent interleaved fingers of the second plurality of interleaved fingers. The first pitch is different than the second pitch.

BRIEF DESCRIPTION OF THE DRAWINGS

The accompanying drawings, which are incorporated into and form a part of this specification, illustrate one or more example aspects of the present disclosure and, together with the detailed description, serve to explain their principles and implementations.

FIG. 2B is an expanded schematic cross-sectional view of an alternative configuration of the XBAR of FIG. 1.

FIG. 2C is an expanded schematic cross-sectional view of another alternative configuration of the XBAR of FIG. 1.

FIG. 2D is an expanded schematic cross-sectional view of another alternative configuration of the XBAR of FIG. 1.

FIG. 3A is an alternative schematic cross-sectional view of the XBAR of FIG. 1.

FIG. 3B is an alternative schematic cross-sectional view of the XBAR of FIG. 1.

Throughout this description, elements appearing in figures are assigned three-digit or four-digit reference designators, where the two least significant digits are specific to the element and the one or two most significant digit is the figure number where the element is first introduced. An element that is not described in conjunction with a figure may be presumed to have the same characteristics and function as a previously-described element having the same reference designator.

DETAILED DESCRIPTION

Figure 1:
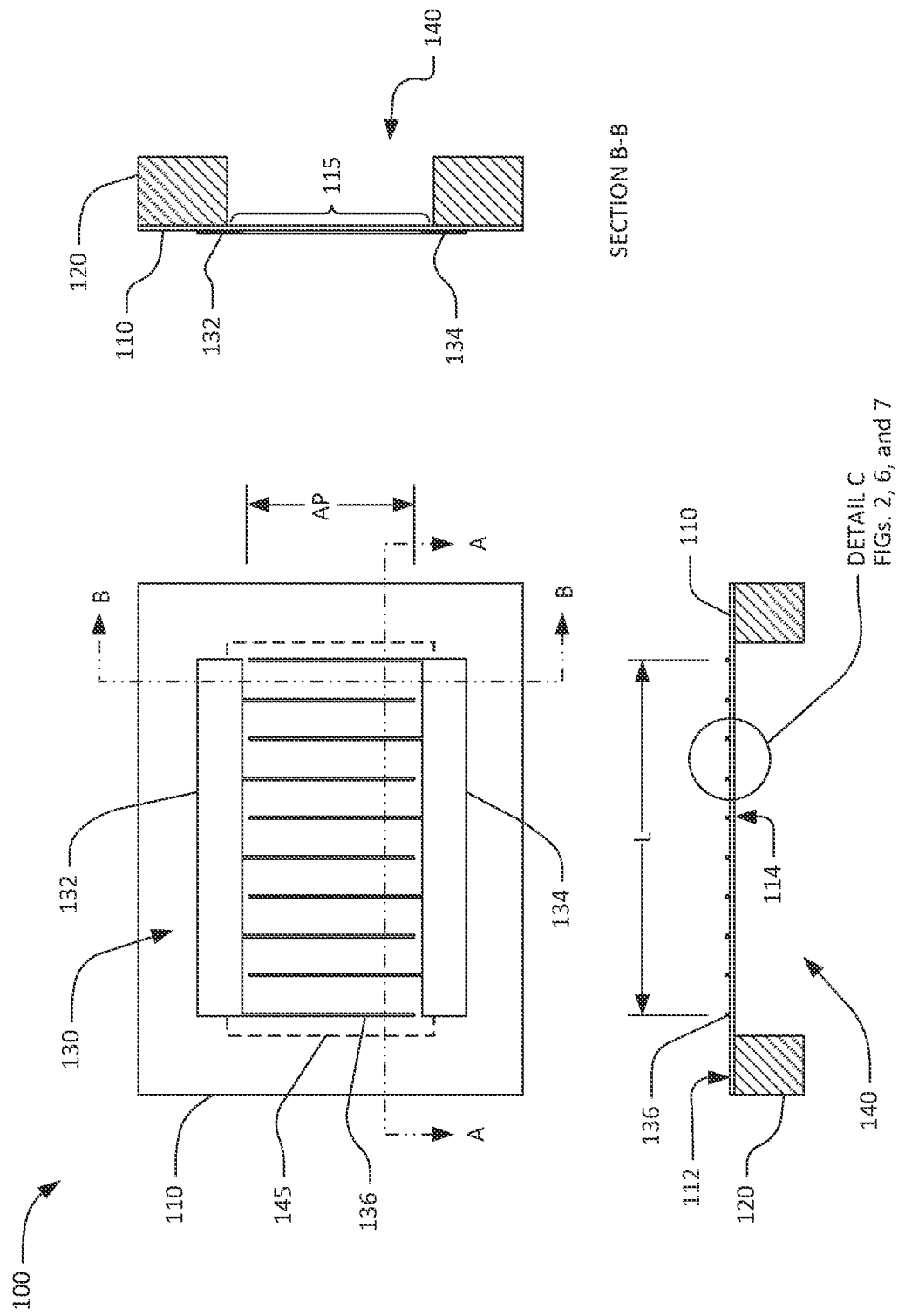
FIG. 1 includes a schematic plan view and two schematic cross-sectional views of a transversely-excited film bulk acoustic resonator (XBAR).

FIG. 1 shows a simplified schematic top view and orthogonal cross-sectional views of a transversely-excited film bulk acoustic resonator (XBAR) 100. XBAR resonators, such as the resonator 100, may be used in a variety of RF filters including band-reject filters, band-pass filters, duplexers, and multiplexers. XBARs are particularly suited for use in filters for communications bands with frequencies above 3 GHz.

In general, the XBAR 100 is made up of a thin film conductor pattern formed at one or both surfaces of a piezoelectric plate 110 having parallel front and back surfaces 112, 114, respectively (also referred to generally first and second surfaces, respectively). The piezoelectric plate is a thin single-crystal layer of a piezoelectric material, such as lithium niobate, lithium tantalate, lanthanum gallium silicate, gallium nitride, or aluminum nitride. The piezoelectric plate is cut such that the orientation of the X, Y, and Z crystalline axes with respect to the front and back surfaces is known and consistent. In the examples described herein, the piezoelectric plates are Z-cut, which is to say the Z axis is normal to the front and back surfaces 112, 114. However, XBARs may be fabricated on piezoelectric plates with other crystallographic orientations including rotated Z-cut and rotated YX cut.

The back surface 114 of the piezoelectric plate 110 is supported by (e.g., attached directly or indirectly) to a surface of the substrate 120 except for a portion of the piezoelectric plate 110 that forms a diaphragm 115 spanning a cavity 140 formed in the substrate. The portion of the piezoelectric plate that spans (e.g., extends over) the cavity is referred to herein as the "diaphragm" 115 due to its physical resemblance to the diaphragm of a microphone. As shown in FIG. 1, the diaphragm 115 is contiguous with the rest of the piezoelectric plate 110 around all of a perimeter 145 of the cavity 140. In this context, "contiguous" means "continuously connected without any intervening item". However, as discussed in more detail below, the diaphragm 115 can be configured with at least 50% of the edge surface of the diaphragm 115 coupled to the edge of the piezoelectric plate 110.

Moreover, the substrate 120 provides mechanical support to the piezoelectric plate 110. The substrate 120 may be, for example, silicon, sapphire, quartz, or some other material or combination of materials. The back surface 114 of the piezoelectric plate 110 may be bonded to the substrate 120 using a wafer bonding process. Alternatively, the piezoelectric plate 110 may be grown on the substrate 120 or supported by, or attached to, the substrate in some other manner.

For purposes of this disclosure, "cavity" has its conventional meaning of "an empty space within a solid body." The cavity 140 may be a hole completely through the substrate 120 (as shown in Section A-A and Section B-B) or a recess in the substrate 120 (as shown subsequently in FIG. 3A and FIG. 3B). The cavity 140 may be formed, for example, by selective etching of the substrate 120 before or after the piezoelectric plate 110 and the substrate 120 are attached, either directly or indirectly.

The conductor pattern of the XBAR 100 includes an interdigital transducer (IDT) 130. The IDT 130 includes a first plurality of parallel fingers, such as finger 136, extending from a first busbar 132 and a second plurality of fingers extending from a second busbar 134. The first and second pluralities of parallel fingers are interleaved with each other. The interleaved fingers overlap for a distance AP, commonly referred to as the "aperture" of the IDT. The center-to-center distance L between the outermost fingers of the IDT 130 is the "length" of the IDT.

In the examples of FIG. 1, FIG. 3A. and FIG. 3B, the IDT 130 is on the front surface 112 (e.g., the first surface) of the piezoelectric plate 110. In other configurations, the IDT 130 may be on the back surface 114 (e.g., the second surface) of the piezoelectric plate 110 or on both the front and back surfaces 112, 114 of the piezoelectric plate 110.

The first and second busbars 132, 134 are configured as the terminals of the XBAR 100. A radio frequency or microwave signal applied between the two busbars 132, 134 of the IDT 130 excites a primary acoustic mode within the piezoelectric plate 110. As will be discussed in further detail, the primary acoustic mode is a bulk shear mode where acoustic energy propagates along a direction substantially orthogonal to the surface of the piezoelectric plate 110, which is also normal, or transverse, to the direction of the electric field created by the IDT fingers. Thus, the XBAR is considered a transversely-excited film bulk wave resonator.

The IDT 130 is positioned at or on the piezoelectric plate 110 such that at least the fingers of the IDT are extend at or on the diaphragm 115 of the piezoelectric plate that spans, or is suspended over, the cavity 140. As shown in FIG. 1, the cavity 140 has a rectangular cross section with an extent greater than the aperture AP and length L of the IDT 130. According to other exemplary aspects, the cavity of an XBAR may have a different cross-sectional shape, such as a regular or irregular polygon. The cavity of an XBAR may have more or fewer than four sides, which may be straight or curved.

For ease of presentation in FIG. 1, the geometric pitch and width of the IDT fingers is greatly exaggerated with respect to the length (dimension L) and aperture (dimension AP) of the XBAR. A typical XBAR has more than ten parallel fingers in the IDT. For example, an XBAR may have hundreds, possibly thousands, of parallel fingers in the IDT according to exemplary aspects. Similarly, the thickness of the fingers in the cross-sectional views is greatly exaggerated.

Figure 2A:
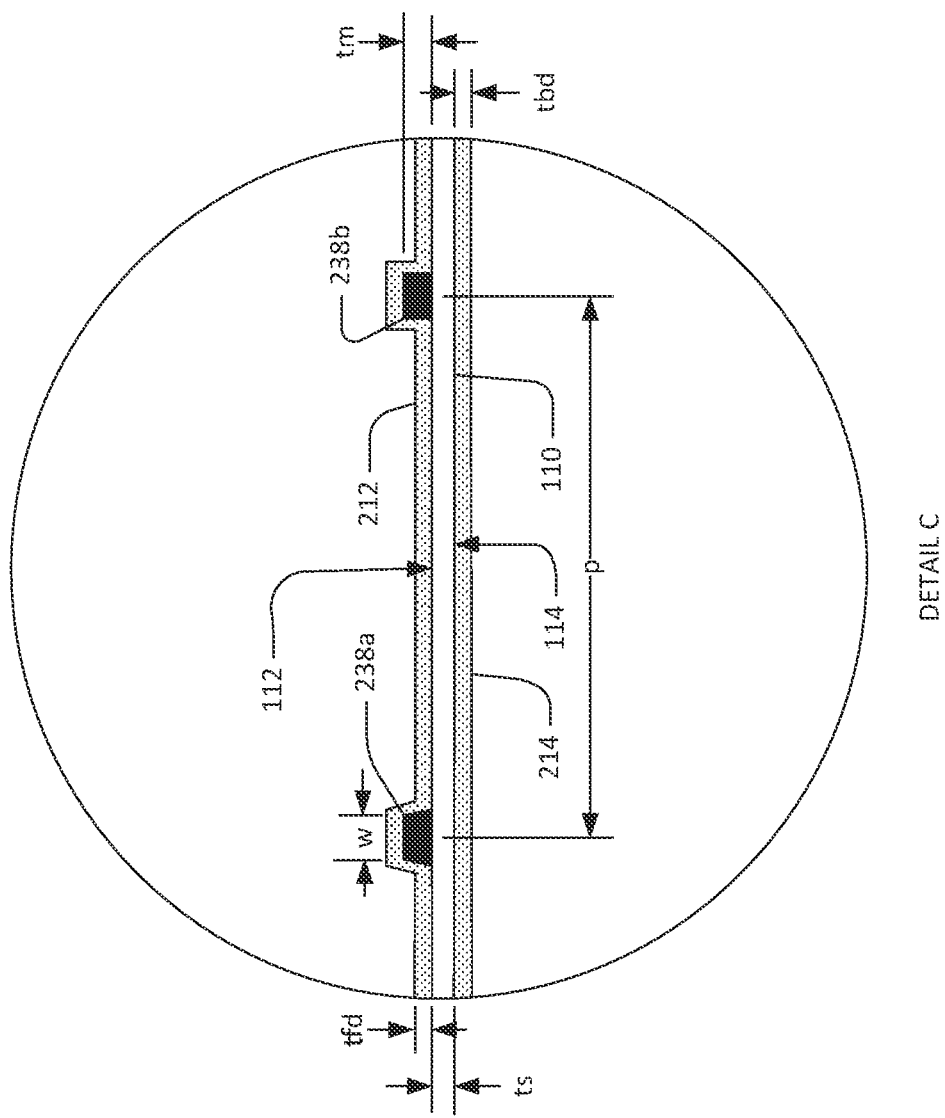
FIG. 2A is an expanded schematic cross-sectional view of a portion of the XBAR of FIG. 1.

FIG. 2A shows a detailed schematic cross-sectional view of the XBAR 100 of FIG. 1. The piezoelectric plate 110 is a single-crystal layer of piezoelectrical material having a thickness ts. ts may be, for example, 100 nm to 1500 nm. When used in filters for 5G NR and Wi-Fi™ bands from 3.4 GHZ to 7 GHz, the thickness ts may be, for example, 150 nm to 500 nm.

A front-side dielectric layer 212 (e.g., a first dielectric coating layer or material) can be formed on the front side 112 of the piezoelectric plate 110. The "front side" of the XBAR is, by definition, the surface facing away from the substrate. The front-side dielectric layer 212 has a thickness tfd. As shown in FIG. 2A the front-side dielectric layer 212 covers the IDT fingers 238a, 238b. Although not shown in FIG. 2A, the front side dielectric layer 212 may also be deposited only between the IDT fingers 238a, 238b. In this case, an additional thin dielectric layer (not shown) may be deposited over the IDT fingers to seal and passivate the fingers. Further, although also not shown in FIG. 2A, the front side dielectric layer 212 may also be deposited only on select IDT fingers 238a.

A back-side dielectric layer 214 (e.g., a second dielectric coating layer or material) can be formed on the back side 114 of the piezoelectric plate 110. In general, for purposes of this disclosure, the term "back-side" means on a side opposite the conductor pattern of the IDT structure and/or opposite the front-side dielectric layer 212. Moreover, the back-side dielectric layer 214 has a thickness tbd. The front-side and back-side dielectric layers 212, 214 may be a non-piezoelectric dielectric material, such as silicon dioxide or silicon nitride. tfd and tbd may be, for example, 0 to 500 nm. tfd and tbd are typically less than the thickness ts of the piezoelectric plate. tfd and tbd are not necessarily equal, and the front-side and back-side dielectric layers 212, 214 are not necessarily the same material. Either or both of the front-side and back-side dielectric layers 212, 214 may be formed of multiple layers of two or more materials according to various exemplary aspects.

The IDT fingers 238a, 238b may be aluminum, substantially aluminum alloys, copper, substantially copper alloys, beryllium, gold, or some other conductive material. Thin (relative to the total thickness of the conductors) layers of other metals, such as chromium or titanium, may be formed under and/or over the fingers to improve adhesion between the fingers and the piezoelectric plate 110 and/or to passivate or encapsulate the fingers. The busbars (132, 134 in FIG. 1) of the IDT may be made of the same or different materials as the fingers. The cross-sectional shape of the IDT fingers may be trapezoidal (finger 238a), rectangular (finger 238b) or some other shape.

Dimension p is the center-to-center spacing between adjacent IDT fingers, such as the IDT fingers 238a, 238b in FIGS. 2A-2C. The center-to-center spacing may be constant over the length of the IDT, in which case the dimension p may be referred to as the pitch of the IDT and/or the pitch of the XBAR. The center-to-center spacing may vary along the length of the IDT, in which case the pitch of the IDT is the average value of dimension p over the length of the IDT. Each IDT finger, such as the IDT fingers 238a, 238b in FIGS. 2A, 2B, and 2C, has a width w measured normal to the long direction of each finger. The width w may also be referred to herein as the "mark." The width of the IDT fingers may be constant over the length of the IDT, in which case the dimension w is the width of each IDT finger. The width of individual IDT fingers may vary along the length of the IDT 130, in which case dimension w is the average value of the widths of the IDT fingers over the length of the IDT. Note that the pitch p and the width w of the IDT fingers are measured in a direction parallel to the length L of the IDT, as defined in FIG. 1.

The IDT of an XBAR differs substantially from the IDTs used in surface acoustic wave (SAW) resonators, primarily in that IDTs of an XBAR excite a shear thickness mode, as described in more detail below with respect to FIG. 4, where SAW resonators excite a surface wave in operation. Moreover, in a SAW resonator, the pitch of the IDT is one-half of the acoustic wavelength at the resonance frequency. Additionally, the mark-to-pitch ratio of a SAW resonator IDT is typically close to 0.5 (i.e., the mark or finger width is about one-fourth of the acoustic wavelength at resonance). In an XBAR, the pitch p of the IDT is typically 2 to 20 times the width w of the fingers. In addition, the pitch p of the IDT is typically 2 to 20 times the thickness ts of the piezoelectric plate 110. Moreover, the width of the IDT fingers in an XBAR is not constrained to one-fourth of the acoustic wavelength at resonance. For example, the width of XBAR IDT fingers may be 500 nm or greater, such that the IDT can be fabricated using optical lithography. The thickness tm of the IDT fingers may be from 100 nm to about equal to the width w, as the lithography process typically cannot support a configuration where the thickness is greater than the width. The thickness of the busbars (132, 134 in FIG. 1) of the IDT may be the same as, less than, greater than, or any combination thereof, the thickness tm of the IDT fingers. It is noted that the XBAR devices described herein are not limited to the ranges of dimensions described herein.

Moreover, unlike a SAW filter, the resonance frequency of an XBAR is dependent on the total thickness of its diaphragm (i.e., in the vertical or thickness direction), including the piezoelectric plate 110, and the front-side and back-side dielectric layers 212, 214 disposed thereon. As described in more detail below, the thickness of one or both dielectric layers can be varied to change the resonance frequencies of various XBARs in a filter. For example, shunt resonators in a ladder filter circuit may incorporate thicker dielectric layers to reduce the resonance frequencies of the shunt resonators relative to series resonators with thinner dielectric layers, and, thus a thinner overall thickness.

Referring back to FIG. 2A, the thickness tfd of the front-side dielectric layer 212 over the IDT fingers 238a, 238b may be greater than or equal to a minimum thickness required to deal and passivate the IDT fingers and other conductors on the front side 112 to the piezoelectric plate 110. The minimum thickness may be, for example, 10 nm to 50 nm depending on the material of the front side dielectric layer and method of deposition according to an exemplary aspect. The thickness of the back-side dielectric layer 214 may be configured to specific thickness to adjust the resonance frequency of the resonator as will be described in more detail below.

Although FIG. 2A discloses a configuration in which IDT fingers 238a and 238b are on the front side 112 of the piezoelectric plate 110, alternative configurations can be provided. For example, FIG. 2B shows an alternative configuration in which the IDT fingers 238a, 238b are on the back side 114 of the piezoelectric plate 110 and are covered by a back-side dielectric layer 214. A front side dielectric layer 212 may cover the front side 112 of the piezoelectric plate 110. In exemplary aspects, a dielectric layer disposed on the diaphragm of each resonator can be trimmed or etched to adjust the resonant frequency. However, if the dielectric layer is on the side of the diaphragm facing the cavity, there may be a change in spurious modes (e.g., generated by the coating on the fingers), which would need to be addressed. Moreover, with the passivation layer coated on top of the IDTs, the mark changes, which can also cause spurs. Therefore, disposing the IDT fingers 238a, 238b on the back side 114 of the piezoelectric plate 110 as shown in FIG. 2B may eliminate the need to address both the change in frequency as well as the effect it has on spurs as compared when the IDT fingers 238a and 238b are on the front side 112 of the piezoelectric plate 110.

FIG. 2C shows an alternative configuration in which IDT fingers 238a, 238b are on the front side 112 of the piezoelectric plate 110 and are covered by a front-side dielectric layer 212. IDT fingers 238c, 238d are on the back side 114 of the piezoelectric plate 110 and are also covered by a back-side dielectric layer 214. As previously described, the front-side and back-side dielectric layer 212, 214 are not necessarily the same thickness or the same material.

FIG. 2D shows another alternative configuration in which IDT fingers 238a, 238b are on the front side 112 of the piezoelectric plate 110 and are covered by a front-side dielectric layer 212. The surface of the front-side dielectric layer is planarized. The front-side dielectric layer may be planarized, for example, by polishing or some other method. A thin layer of dielectric material having a thickness tp may cover the IDT finger 238a, 238b to seal and passivate the fingers. The dimension TP may be, for example, 10 nm to 50 nm.

FIG. 3A and FIG. 3B show two alternative cross-sectional views along the section plane A-A defined in FIG. 1. In FIG. 3A, a piezoelectric plate 310 (corresponding to piezoelectric plate 110 discussed above) is supported by a substrate 320, which can correspond to substrate 120 of FIG. 1. Moreover, a cavity 340, which does not fully penetrate the substrate 320, is formed in the substrate under the portion of the piezoelectric plate 310 containing the IDT of an XBAR. The cavity 340 can correspond to cavity 140 of FIG. 1 in an exemplary aspect. Moreover, the cavity 340 may be formed, for example, by etching the substrate 320 before attaching the piezoelectric plate 310. Alternatively, the cavity 340 may be formed by etching the substrate 320 with a selective etchant that reaches the substrate through one or more openings provided in the piezoelectric plate 310.

FIG. 3B illustrates an alternative aspect in which the substrate 320 includes a base 322 and an intermediate layer 324 that is disposed between the piezoelectric plate 310 and the base 322. For example, the base 322 may be silicon and the intermediate layer 324 may be silicon dioxide or silicon nitride or some other material, e.g., an intermediate dielectric layer. That is, in this aspect, the base 322 and the intermediate layer 324 are collectively considered the substrate 320. Although not shown in FIG. 3B, the substrate 320 may include more than one intermediate layer between the base 322 and the piezoelectric plate 310. As further shown, cavity 340 is formed in the intermediate layer 324 under the portion of the piezoelectric plate 310 containing the IDT fingers of an XBAR. The cavity 340 may be formed, for example, by etching the intermediate layer 324 before attaching the piezoelectric plate 310. Alternatively, the cavity 340 may be formed by etching the intermediate layer 324. In some cases, the etching may be performed with a selective etchant that reaches the substrate through one or more openings (not shown) provided in the piezoelectric plate 310. In this case, the diaphragm 315, which can correspond to diaphragm 115 of FIG. 1 in an exemplary aspect, may be contiguous with the rest of the piezoelectric plate 310 around a large portion of a perimeter of the cavity 340. For example, the diaphragm 315 may be contiguous with the rest of the piezoelectric plate 310 around at least 50% of the perimeter of the cavity 340. As shown in FIG. 3B, the cavity 340 extends completely through the intermediate layer 324. That is, the diaphragm 315 can have an outer edge that faces the piezoelectric plate 310 with at least 50% of the edge surface of the diaphragm 315 coupled to the edge of the piezoelectric plate 310 facing the diaphragm 315. This configuration provides for increased mechanical stability of the resonator.

In other configurations, the cavity 340 may extend into, but not though the intermediate layer 324 (i.e., the intermediate layer 324 may extend over the bottom of the cavity on top of the base 322), or may extend through the intermediate layer 324 into the base 322.

Figure 4:
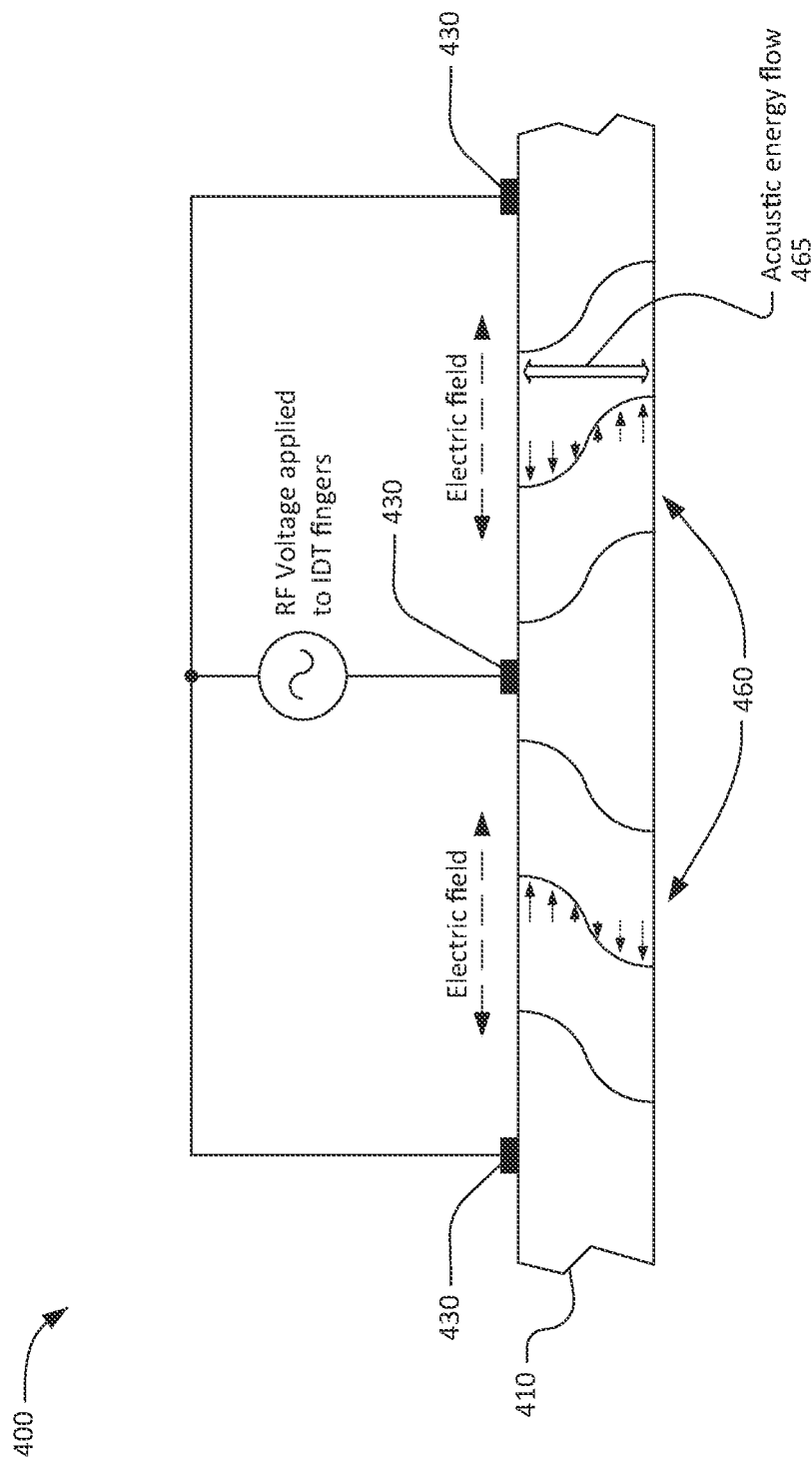
FIG. 4 is a graphic illustrating a shear horizontal acoustic mode in an XBAR.

FIG. 4 is a graphical illustration of the primary acoustic mode of interest in an XBAR. FIG. 4 shows a small portion of an XBAR 400 including a piezoelectric plate 410 and three interleaved IDT fingers 430. In general, the exemplary configuration of XBAR 400 can correspond to any of the configurations described above and shown in FIGS. 2A to 2D according to an exemplary aspect. Thus, it should be appreciated that piezoelectric plate 410 can correspond to piezoelectric plate 110 and IDT fingers 430 can be implemented according to any of the configurations of fingers 238a and 238b, for example.

In operation, an RF voltage is applied to the interleaved fingers 430. This voltage creates a time-varying electric field between the fingers. The direction of the electric field is lateral, or parallel to the surface of the piezoelectric plate 410, as indicated by the arrows labeled "electric field". Due to the high dielectric constant of the piezoelectric plate 410, the electric field is highly concentrated in the plate relative to the air. The lateral electric field introduces shear deformation in the piezoelectric plate 410, and thus strongly excites a shear-mode acoustic mode, in the piezoelectric plate 410. In this context, "shear deformation" is defined as deformation in which parallel planes in a material remain parallel and maintain a constant distance while translating relative to each other. A "shear acoustic mode" is defined as an acoustic vibration mode in a medium that results in shear deformation of the medium. The shear deformations in the XBAR 400 are represented by the curves 460, with the adjacent small arrows providing a schematic indication of the direction and magnitude of atomic motion as shear acoustic waves in the predominantly lateral direction of the medium, i.e., the piezoelectric plate 410. It is noted that the degree of atomic motion, as well as the thickness of the piezoelectric plate 410, have been exaggerated for ease of visualization in FIG. 4. While the atomic motions are predominantly lateral (i.e., horizontal as shown in FIG. 4), the direction of acoustic energy flow of the excited primary shear acoustic mode is substantially orthogonal to the surface of the piezoelectric plate, as indicated by the arrow 465.

An acoustic resonator based on shear acoustic wave resonances can achieve better performance than current state-of-the art film-bulk-acoustic-resonators (FBAR) and solidly-mounted-resonator bulk-acoustic-wave (SMR BAW) devices where the electric field is applied in the thickness direction. In such devices, the acoustic mode is compressive with atomic motions and the direction of acoustic energy flow in the thickness direction. In addition, the piezoelectric coupling for shear wave XBAR resonances can be high (>20%) compared to other acoustic resonators. Thus, high piezoelectric coupling enables the design and implementation of microwave and millimeter-wave filters with appreciable bandwidth.

Figure 5:
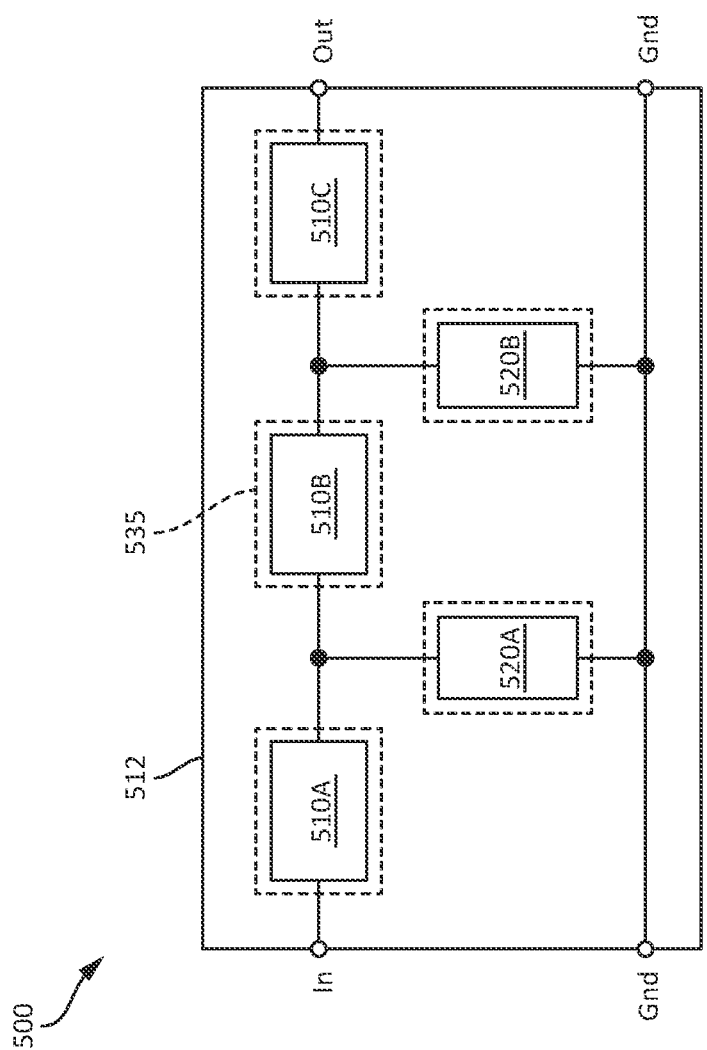
FIG. 5 is a schematic block diagram of a filter using XBAR resonators of FIG. 1.

FIG. 5 is a schematic circuit diagram and layout for a high frequency band-pass filter 500 using XBAR resonators, such as the XBAR 100 discussed above in reference to FIG. 1. The filter 500 has a ladder filter architecture including three series resonators 510A, 510B, 510C and two shunt resonators 520A, 520B. As shown, the three series resonators 510A, 510B, and 510C are connected in series between a first port and a second port. In FIG. 5, the first and second ports are labeled "In" and "Out", respectively. However, the filter 500 is bidirectional and either port and serve as the input or output of the filter. The two shunt resonators 520A, 520B are connected from nodes between the series resonators to ground. All the shunt resonators and series resonators are XBARs on a single die.

In an exemplary aspect, the three series resonators 510A, B, C and the two shunt resonators 520A, B of the filter 500 are formed on a single plate 512 of piezoelectric material bonded to a silicon substrate (not visible). The series and shunt resonators 510A, 510B, 510C, 520A, 520B all have a bonding layer formed on a plate of piezoelectric material. The three series resonators 510A, B, C and the two shunt resonators 520A, B have one or more plates of piezoelectric material bonded to the bonding layer. As will be described in more detail below, the pitches of the interleaved fingers of each IDT on respective resonators can be varied or different to vary the resonance frequency during operation. In general, series resonators, such as series resonators 510A, B, C, can have a first plurality of interleaved fingers having a first pitch, where the shunt resonators, such as shunt resonators 520A and 520B will have a second plurality of interleaved fingers having a second pitch that is different than the first pitch. As a result, the series resonators will have a higher resonance frequency than that of the shunt resonators.

According to an exemplary aspect, each of the series resonators 510A, B, C, and the shunt resonators 520A and 520B can have an XBAR configuration as described above with respect to FIGS. 1-3 in which a diaphragm with IDT fingers spans over a cavity. However, in an alternative aspect, the series resonators 510A, B, C, and the shunt resonators 520A and 520B can be solidly mounted in which the diaphragm with IDT fingers is mounted on or above a Bragg mirror, which is in turn can be mounted on a substrate. An example of such a configuration is described in U.S. Pat. No. 11,165,407, entitled "Solidly-mounted transversely-excited film bulk acoustic resonator", the contents of which are hereby incorporated by reference.

In either case, it should be appreciated that each of series resonators 510A, B, C may have a different pitch from each other to vary the resonance frequencies, and similarly shunt resonators 520A and 520B may also have a different pitch from each other to vary the resonance frequencies. Thus, in an exemplary aspect, a first resonator of the filter device 500 may have an IDT with a first pitch that is a first center-to-center spacing between adjacent interleaved fingers of the first plurality of interleaved fingers, while a second resonator of the filter device 500 may have an IDT with a second pitch that is a second center-to-center spacing between adjacent interleaved fingers of the second plurality of interleaved fingers. In various alternative embodiments, either of the first and/or second pitches may be constant over the lengths of the respective IDT. In additional alternative embodiments, either of the first and/or second pitches may be varied over the lengths of the respective IDT. These difference configurations may be set to vary resonance frequencies of the individual XBARs and thus adjust the frequency characteristics of filter device 500 as a whole in operation. This configuration also avoids the need to vary the thicknesses of the different XBARs of the filter, which in turn will reduce manufacturing steps and also reduce the overall size of the device.

Moreover, each resonator includes a respective IDT (not shown), such as the IDT 130 of FIG. 1, with at least the fingers of the IDT disposed over a cavity, such as the cavity 140 in the substrate 120 of FIG. 1, and at or on at least one surface of a piezoelectric material, such as the piezoelectric plate 110 of FIG. 1. In this and similar contexts, the term "respective" means "relating things each to each," which is to say with at least a one-to-one correspondence. In FIG. 5, the cavities are illustrated schematically as the dashed rectangles (such as the rectangle 535). In this example, each IDT is disposed over a respective cavity. In other filters, the IDTs of two or more resonators may be disposed over a single cavity. Moreover, according to an exemplary aspect as described as follows, two or more of the plurality of the three series resonators 510A, B, C and the two shunt resonators 520A, B of the filter 500 can have passivation layer configurations on the IDT structure.

Figure 6:
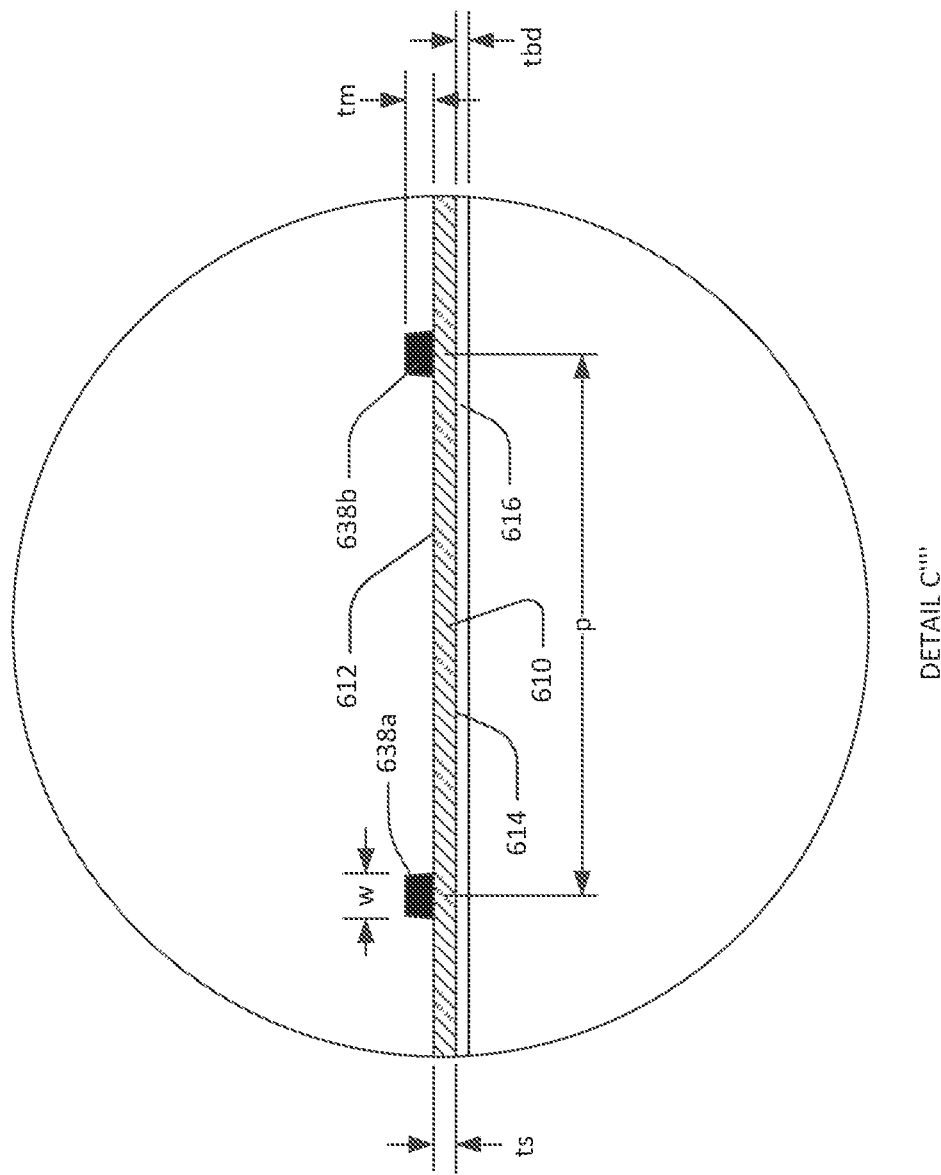
FIG. 6 is an expanded schematic cross-sectional view of an alternative configuration of the XBAR of FIG. 1.

FIG. 6 is an expanded schematic cross-sectional view of an alternative configuration of the XBAR of FIG. 1. In accordance with an aspect of the disclosure, the piezoelectric plate 610 is a single-crystal layer of piezoelectrical material having a thickness ts. ts may be, for example, 100 nm to 1500 nm. When used in filters for 5G NR and Wi-Fi™ bands from 3.4 GHZ to 7 GHz, the thickness ts may be, for example, 150 nm to 500 nm.

In contrast to FIGS. 2A, 2B, 2C and 2D described above, a front-side dielectric layer (e.g., a first dielectric coating layer or material) is not formed on the front side 612 of the piezoelectric plate 610. The "front side" of the XBAR is, by definition, the surface facing away from the substrate. As shown in FIG. 6 without a front-side dielectric layer, the IDT fingers 638a, 638b are not covered in dielectric material. In another aspect, an additional thin layer (not shown) may be deposited over the IDT fingers to seal and passivate the fingers.

As further shown, a back-side dielectric layer 616 (e.g., a dielectric coating layer or material) can be formed on the back side 614 of the piezoelectric plate 610. In general, for purposes of this disclosure, the term "back-side" means on a side opposite the conductor pattern of the IDT structure and/or opposite the front-side 612. Moreover, the back-side dielectric layer 616 has a thickness tbd. The back-side dielectric layer 616 may be a non-piezoelectric dielectric material, such as silicon dioxide or silicon nitride. tbd may be, for example, 0 to 500 nm. tbd is typically less than the thickness ts of the piezoelectric plate. The back-side dielectric layer 616 may be formed of multiple layers of two or more materials according to various exemplary aspects. In some exemplary aspects, the back-side dielectric layer 616 may be configured to tune the frequency of the resonator, such as the XBAR 100 of FIG. 1.

The IDT fingers 638a, 638b may be aluminum, substantially aluminum alloys, copper, substantially copper alloys, beryllium, gold, or some other conductive material. Thin (relative to the total thickness of the conductors) layers of other metals, such as chromium or titanium, may be formed under and/or over the fingers to improve adhesion between the fingers and the piezoelectric plate 610 and/or to passivate or encapsulate the fingers. The busbars (e.g., 132, 134 in FIG. 1) of the IDT may be made of the same or different materials as the fingers. The cross-sectional shape of the IDT fingers may be trapezoidal (fingers 638a and 638b), rectangular, or some other shape.

As described above, dimension p is the center-to-center spacing (i.e., the "pitch") between adjacent IDT fingers, such as the IDT fingers 638a, 638b. Note, p illustrated in FIG. 6 may be different than p illustrated in FIGS. 2A, 2B, and 2C, as described above. In one aspect of the disclosure, the center-to-center spacing may not be constant (i.e., it may vary) over the length of the IDT, for example, p may vary between IDT fingers. For example, p between 638a and 638b may be X, and p between 638b and the next IDT finger (not shown) may be X+Y or X-Y such that the pitch of interleaved fingers is varying over the length of the diaphragm. In another aspect of the disclosure, the center-to-center spacing may be constant over the length of the IDT, in which case the dimension p may be referred to as the pitch of the IDT and/or the pitch of the XBAR in FIG. 6. The center-to-center spacing may vary along the length of the IDT, in which case the pitch of the IDT is the average value of dimension p over the length of the IDT.

Moreover, in an exemplary aspect, each IDT finger, such as the IDT fingers 638a, 638b in FIG. 6, has a width w measured normal to the long direction of each finger. The width w may also be referred to herein as the "mark." The width of the IDT fingers may be constant over the length of the IDT, in which case the dimension w is the width of each IDT finger. The width of individual IDT fingers may vary along the length of the IDT, in which case dimension w is the average value of the widths of the IDT fingers over the length of the IDT. Note that the pitch p and the width w of the IDT fingers are measured in a direction parallel to the length L of the IDT, as defined in FIG. 1.

The IDT of an XBAR differs substantially from the IDTs used in surface acoustic wave (SAW) resonators. In a SAW resonator, the pitch of the IDT is one-half of the acoustic wavelength at the resonance frequency. Additionally, the mark-to-pitch ratio of a SAW resonator IDT is typically close to 0.5 (i.e., the mark or finger width is about one-fourth of the acoustic wavelength at resonance). In an XBAR, the pitch p of the IDT is typically 2 to 20 times the width w of the fingers. In addition, the pitch p of the IDT is typically 2 to 20 times the thickness ts of the piezoelectric plate 610. Moreover, the width of the IDT fingers in an XBAR is not constrained to one-fourth of the acoustic wavelength at resonance. For example, the width of XBAR IDT fingers may be 500 nm or greater, such that the IDT can be fabricated using optical lithography. The thickness tm of the IDT fingers may be from 100 nm to about equal to the width w. The thickness of the busbars (132, 134 in FIG. 1) of the IDT may be the same as, less than, greater than, or any combination thereof, the thickness tm of the IDT fingers.

Moreover, and as described in more detail below, the pitch p can be varied to adjust the resonance frequencies of various XBARs in a filter. For example, shunt resonators in a ladder filter circuit should have a lower resonance frequency than the series resonators. In order to achieve this configuration, XBAR filters conventionally incorporate thicker dielectric layers to reduce the resonance frequencies of the shunt resonators relative to series resonators with thinner dielectric layers, and, thus a thinner overall thickness. However, as described herein, the pitch of each respective XBAR can be varied to adjust the resonance frequencies. In particular, a filter device may have both a series resonator with a first pitch and a shunt resonator with a second pitch, with the first pitch being less than the second pitch. As a result, first (e.g., series) resonator will have a higher resonance frequency that the second (e.g., shunt) resonator. Advantageously, any dielectric layer applied to the filter device can be uniformly applied, for example, as a passivation layer only. As a result, the dielectric layer does not need to be trimmed (e.g., etched) to adjust the resonance frequency of a particular XBAR device, which in turn, reduces the complexity and steps of manufacturing of the filter device and also provides for a smaller overall stack of each XBAR thickness. It is also reiterated that each series resonator may have a different pitch from each other in an exemplary aspect, and/or, similarly, each shunt resonator may have a different pitch from each other in an exemplary aspect.

In accordance with an exemplary aspect of the disclosure, and as described with reference to FIG. 6, a front-side dielectric layer may be absent from the front-side 612 of the piezoelectric plate 610. Rather, the pitch dimension p, referred to as the pitch of the IDT and/or the pitch of the XBAR, may be varied to adjust the resonance frequency. Thus, a filter device, such as filter device 500 of FIG. 5, may include a plurality of resonators such as that shown in FIG. 6, with different pitches of its respective IDT fingers, in order to vary the resonant frequency.

Although FIG. 6 discloses a configuration in which IDT fingers 638a and 638b are on the front side 612 of the piezoelectric plate 610, alternative configurations can be provided. For example, IDT fingers 638a, 638b may be located on the back side 614 of the piezoelectric plate 610 (i.e., facing the cavity) and are not covered by a back-side dielectric layer 616. Rather, a front side dielectric layer may cover the front side 612 of the piezoelectric plate 610.

Moreover, as described above, with a passivation layer coated on top of the IDTs, the mark changes, which can cause spurs. Therefore, disposing the IDT fingers 638a, 638b on the back side 614 of the piezoelectric plate 610 may eliminate the need to address both the change in frequency as well as the effect it has on spurs as compared when the IDT fingers 638a and 638b are on the front side 612 of the piezoelectric plate 610.

As described above, a thin coating (passivation layer) may also be uniformly applied to or removed from all XBAR resonators of the filter. The thin coating will increase the thickness range over which the filter may be trimmed. The trimming of the filter allows for adjustment to the correct or desired frequency. Moreover, this approach minimizes the thickness of the thin coating, which should produce a more consistent and repeatable result.

Figure 7:
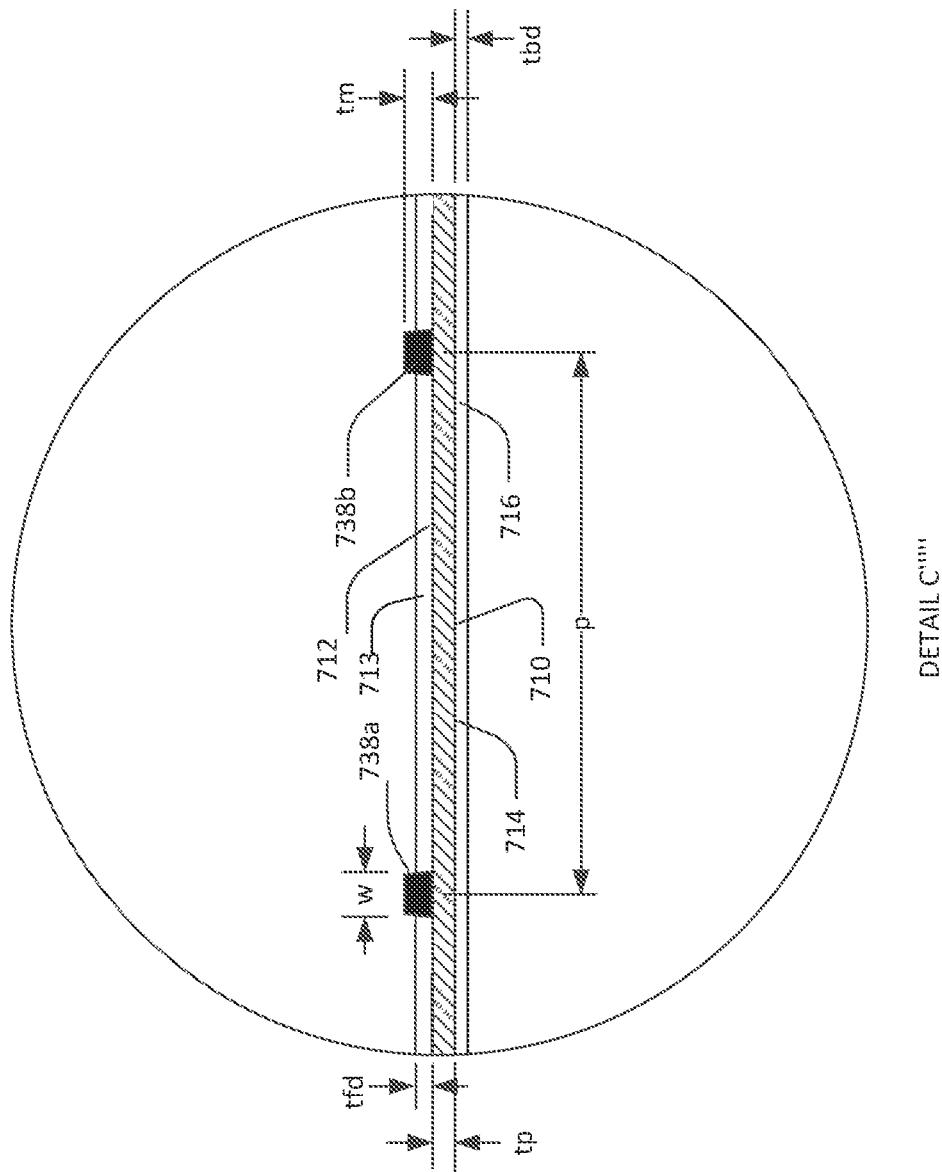
FIG. 7 is an expanded schematic cross-sectional view of an alternative configuration of the XBAR of FIG. 1.

FIG. 7 shows a detailed schematic cross-sectional view of the XBAR 100 of FIG. 1. The piezoelectric plate 710 is a single-crystal layer of piezoelectrical material having a thickness ts. ts may be, for example, 100 nm to 1500 nm. When used in filters for 5G NR and Wi-Fi™ bands from 3.4 GHZ to 7 GHz, the thickness ts may be, for example, 150 nm to 500 nm.

FIG. 7 illustrates an XBAR having a similar configuration as shown in FIG. 6, except that a front-side dielectric layer 713 (e.g., a first dielectric coating layer or material) is also formed on the front side 712 of the piezoelectric plate 710. The front-side dielectric layer 713 has a thickness tfd. As shown in FIG. 7, the front-side dielectric layer 713 may be deposited only between the IDT fingers 738a, 738b. In an exemplary aspect, an additional thin dielectric layer (not shown) may be deposited over the IDT fingers to seal and passivate the fingers.

As further shown, a back-side dielectric layer 716 (e.g., a second dielectric coating layer or material) can be formed on the back side 714 of the piezoelectric plate 710. Moreover, the back-side dielectric layer 716 has a thickness tbd. The front-side and back-side dielectric layers 713, 716 may be a non-piezoelectric dielectric material, such as silicon dioxide or silicon nitride. tfd and tbd may be, for example, 0 to 500 nm. tfd and tbd are typically less than the thickness ts of the piezoelectric plate. tfd and tbd are not necessarily equal, and the front-side and back-side dielectric layers 713 and 716 are not necessarily the same material. Either or both of the front-side and back-side dielectric layers 713 and 716 may be formed of multiple layers of two or more materials according to various exemplary aspects.

The IDT fingers 738a, 738b may be aluminum, substantially aluminum alloys, copper, substantially copper alloys, beryllium, gold, or some other conductive material. Thin (relative to the total thickness of the conductors) layers of other metals, such as chromium or titanium, may be formed under and/or over the fingers to improve adhesion between the fingers and the piezoelectric plate 710 and/or to passivate or encapsulate the fingers. The busbars (132, 134 in FIG. 1) of the IDT may be made of the same or different materials as the fingers. The cross-sectional shape of the IDT fingers may be trapezoidal (fingers 738a and 738b), rectangular or some other shape.

In accordance with an aspect of the disclosure, and as described with reference to FIG. 7, a front-side dielectric layer 713 is applied to the front-side 712 of the piezoelectric plate 710 only between fingers 738a, 738b. Further, the dimension p, referred to as the pitch of the IDT and/or the pitch of the XBAR, may be varied to adjust the resonance frequency.

Although FIG. 7 discloses a configuration in which IDT fingers 738a and 738b are on the front side 712 of the piezoelectric plate 710, alternative configurations can be provided. For example, not illustrated, the IDT fingers 738a, 738b may be located on the back side 714 of the piezoelectric plate 710 and a back-side dielectric layer 716 is applied to the front-side 712 of the piezoelectric plate 710 only between fingers 738a, 738b. Further, a front side dielectric layer may cover the front side 712 of the piezoelectric plate 710.

Referring back to FIG. 7, the thickness tfd of the front-side dielectric layer 713 between the IDT fingers 738a, 738b may be greater than or equal to a minimum thickness required to passivate the IDT fingers and other conductors on the front side 712 to the piezoelectric plate 710 according to an exemplary aspect. The minimum thickness may be, for example, 10 nm to 50 nm depending on the material of the front side dielectric layer and method of deposition according to an exemplary aspect. In an exemplary aspect, the thickness of the back-side dielectric layer 716 may be configured to a specific thickness to adjust the resonance frequency of the resonator as will be described in more detail below.

Moreover, as described above, with a passivation layer coated on top of the IDTs, the mark changes, which can also cause spurs. Therefore, disposing the IDT fingers 738a, 738b on the back side 714 of the piezoelectric plate 710 may eliminate the need to address both the change in frequency as well as the effect it has on spurs as compared when the IDT fingers 738a and 738b are on the top front side 712 of the piezoelectric plate 710.

As described above in an exemplary aspect, filter device 500 can include a plurality of series resonators 510A, 510B and 510C, and a plurality of shunt resonators 520A and 520B. Moreover, each of the series and shunt resonators of such a filter device can comprise the XBAR configuration shown in FIG. 7 that includes either of front-side dielectric layer 713 and/or back-side dielectric layer 716. In either case, the respective dielectric layer can be uniformly applied to coat the surfaces of the respective diaphragms of the both the shunt and series resonators of the filter device 500. As also described herein, the resonance frequencies of each XBAR is set by the respective pitches of each IDT. This configuration allows for a uniform coating of dielectric on either surface of the diaphragm of each XBAR device (e.g., for passivation purposes), which in turn reduces the manufacturing steps (e.g., there is no need to trim the dielectric layer to adjust the resonance frequency between such devices).

Figure 8:
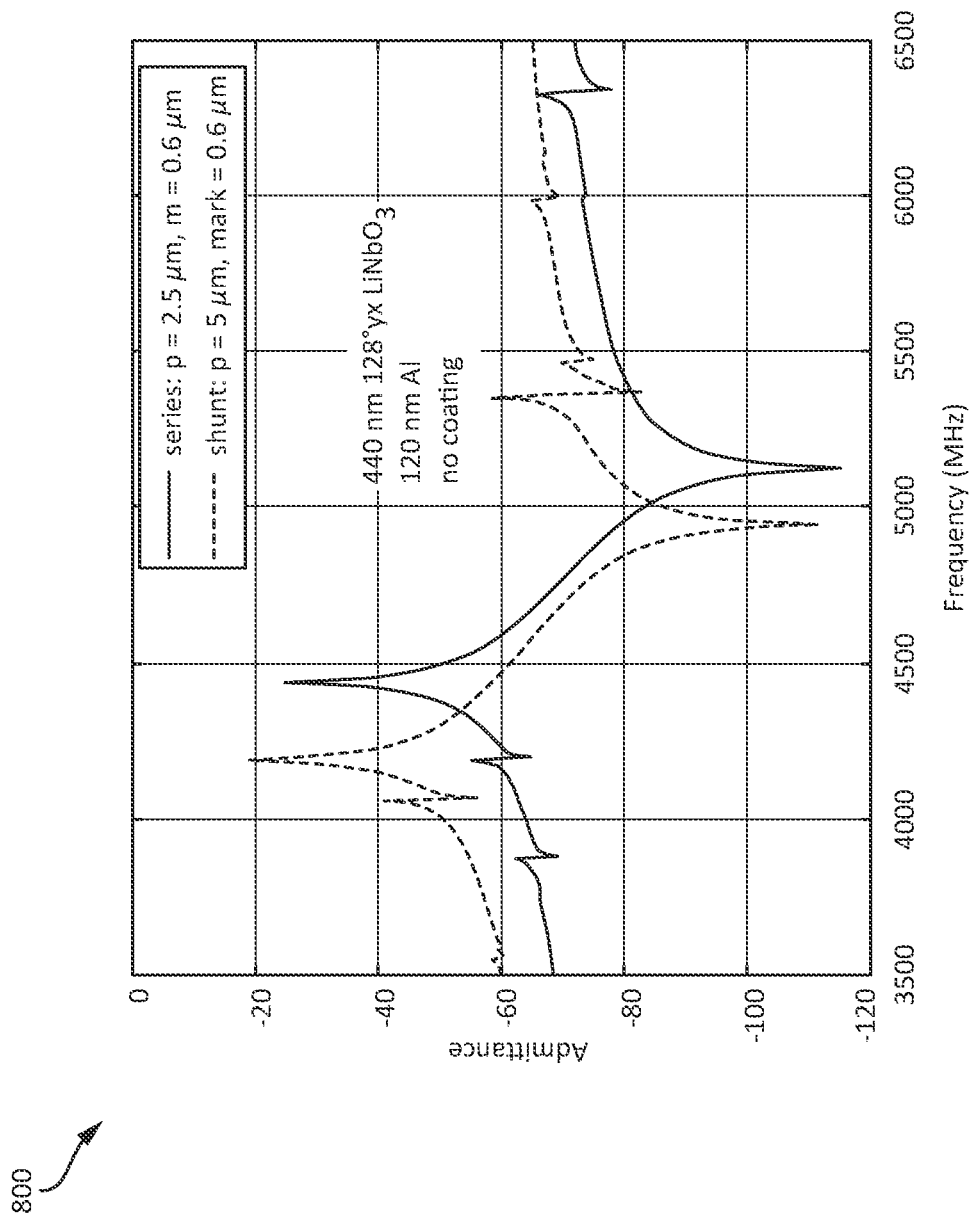
FIG. 8 is a chart of an admittance of XBAR devices as a function of frequency.
Figure 9:
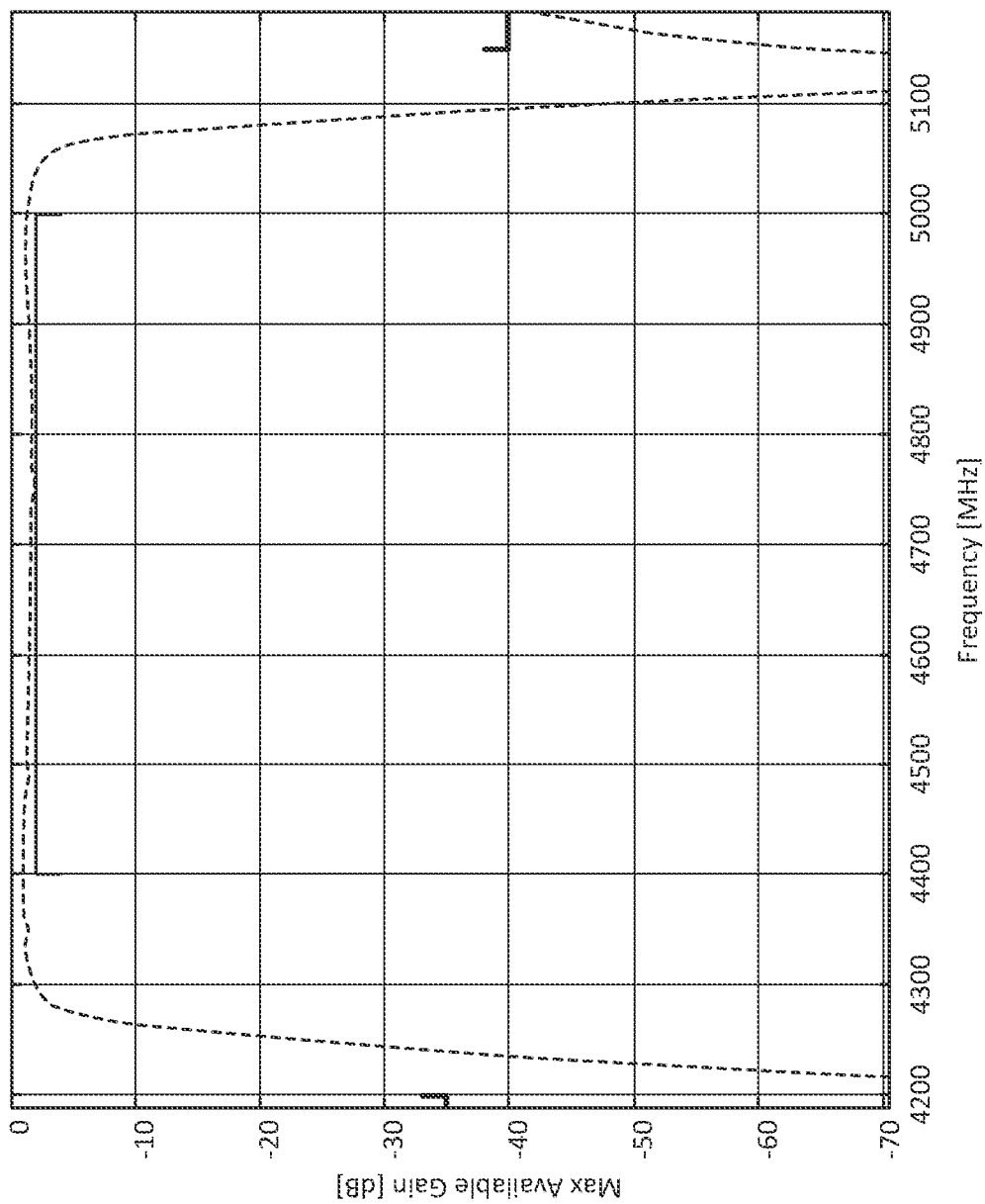
FIG. 9 is a chart of a maximum available gain of a n79 filter using XBAR resonators as a function of frequency.

FIG. 8 is a chart 800 showing the admittance in dB as a function of frequency for the XBAR devices simulated using finite element method (FEM) simulation techniques. In this example, the XBAR devices are formed on a 128° Y-cut lithium niobate plate Euler angles (0°, 38°, 0°). The thickness of the lithium niobate plate is 440 nm. The substrate is silicon, the IDT conductors are aluminum, the dielectric, where present, is $SiO_2$. Chart 800 illustrates a solid line for a series XBAR device having a p distance of 2.5 µm and a m distance of 0.6 µm, and a dashed line for a shunt XBAR device having a p distance of 5 µm and a m distance of 0.6 µm. The parameters of FIG. 8 may be used to create an n79 Filter as illustrated in FIG. 9. As noted above, the two different XBAR devices comprise the same metal and substrate thickness, but different IDT dimensions, specifically, the p dimension. By varying the p dimension the chart illustrates the resonance frequency is adjusted without the use of a dielectric layer covering the IDT fingers. As a result, a filter device (e.g., filter device 500 of FIG. 5) can be configured to have a plurality of XBAR resonators operating at different resonance frequencies by vary the pitches of the IDT fingers on each specific resonator.

FIG. 9 is a chart of the maximum available gain of a n79 filter using XBAR resonators as a function of frequency. In general, the insertion loss (or S21) of a filter is affected by the return loss (RL) and the dissipated loss. While the return loss of the filter is strongly affected by the impedance of the filter and the matching networks applied to its excitation ports, the dissipated loss cannot be avoided when the filter impedance is well-matched to a 50 Ohm measurement network. The maximum available gain of a filter (e.g., as shown in FIG. 9) shows the passband response with an ideal impedance match to a 50 Ohm measurement network at every frequency. This allows for a characterization of the fundamental filter loss without any confusion of interpretation due to reflections caused by impedance mismatch of a filter to a measurement network. Chart 900 illustrates the maximum available gain in dB as a function of the frequency for an n79 filter using the XBAR configurations described herein, which is simulated using finite element method (FEM) simulation techniques.

Figure 10:
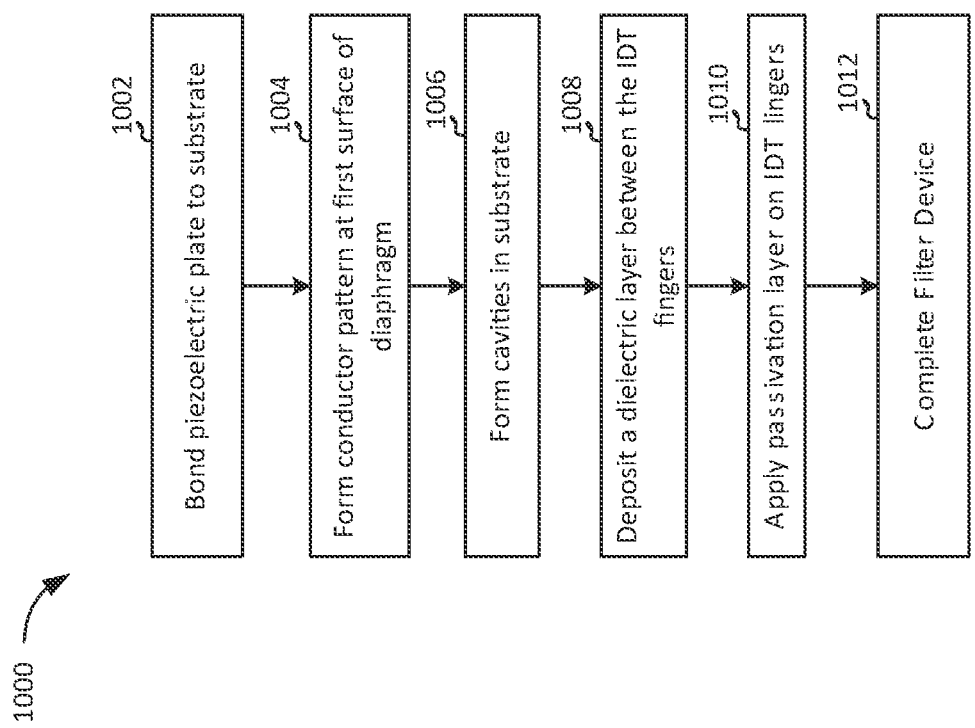
FIG. 10 illustrates a flowchart of a method of manufacturing an XBAR resonator as described herein according to an exemplary aspect.

FIG. 10 illustrates a flowchart of a method of manufacturing an XBAR or a filter without the application of a dielectric layer on the IDT fingers as described herein according to an exemplary aspect. As shown, the method 1000 starts at 1002 with a substrate and a plate of piezoelectric material and ends at 1012 with a completed XBAR or filter. The flow chart of FIG. 10 includes only major process steps for purposes of describing the exemplary manufacturing method. Various conventional process steps (e.g., surface preparation, cleaning, inspection, baking, annealing, monitoring, testing, etc.) may be performed before, between, after, and during the steps shown in FIG. 10, as would be appreciated to one skilled in the art.

The piezoelectric plate may be, for example, Z-cut lithium niobate or lithium tantalate as used in the previously presented examples. The piezoelectric plate may be some other material and/or some other cut. The substrate may preferably be silicon. The substrate may be some other material that allows formation of deep cavities by etching or other processing.

At 1002, the piezoelectric plate is bonded to the substrate. For a filter device, multiple piezoelectric plates may be bonded to the substrate, e.g., one for each resonator in an exemplary aspect. In any case, the piezoelectric plate and the substrate may be bonded by a wafer bonding process. Typically, the mating surfaces of the substrate and the piezoelectric plate are highly polished. One or more layers of intermediate materials, such as an oxide or metal, may be formed or deposited on the mating surface of one or both of the piezoelectric plate and the substrate. One or both mating surfaces may be activated using, for example, a plasma process. The mating surfaces may then be pressed together with considerable force to establish molecular bonds between the piezoelectric plate and the substrate or intermediate material layers.

A variation of the process 1000 is to grow the piezoelectric plate in situ on the substrate. In that process variation, bonding is not required and the action at 1002 would be redefined as "grow piezoelectric plate on substrate."

At 1004, a conductor pattern is deposited or otherwise formed on a first surface of the diaphragm of the piezoelectric plate using a metal deposition and patterning one or more conductor layer on a first surface of the piezoelectric plate. A conductor layer may be, for example, aluminum, an aluminum alloy, copper, a copper alloy, or some other conductive metal. Optionally, one or more layers of other materials may be disposed below (i.e., between the conductor layer and the piezoelectric plate) and/or on top of the conductor layer. For example, a thin film of titanium, chrome, or other metal may be used to improve the adhesion between the conductor layer and the piezoelectric plate. A conduction enhancement layer of gold, aluminum, copper or other higher conductivity metal may be formed over portions of the conductor pattern (for example the IDT bus bars and interconnections between the IDTs).

The conductor pattern may be formed at 1004 by depositing the conductor layer and, optionally, one or more other metal layers in sequence over the surface of the piezoelectric plate. The excess metal may then be removed by etching through patterned photoresist. The conductor layer can be etched, for example, by plasma etching, reactive ion etching, wet chemical etching, and other etching techniques. Alternatively, the conductor pattern may be formed using a lift-off process. Photoresist may be deposited over the piezoelectric plate. And patterned to define the conductor pattern. The conductor layer and, optionally, one or more other layers may be deposited in sequence over the surface of the piezoelectric plate. The photoresist may then be removed, which removes the excess material, leaving the conductor pattern. As also described above, the fingers of the conductor pattern for each resonator may be selected to vary and select a resonance frequency for each respective XBAR device.

At 1006, one or more cavities are formed in the substrate. A separate cavity may be formed for each resonator in a filter device. The one or more cavities may be formed using an anisotropic or orientation-dependent dry or wet etch to open holes from the back side of the substrate to the piezoelectric plate. Alternatively, cavities in the form of recesses in the substrate may be formed by etching the substrate using an etchant introduced through openings in the piezoelectric plate. It should be appreciated that the cavity can be formed before the conductor pattern is formed on the piezoelectric plate in an exemplary aspect. Moreover, another variation of the process 1000 is to form the one or more cavities in the substrate prior to attaching the piezoelectric plate to the substrate. In that process variation, the actions at 804 and 806 occur before the action at 1002.

At 1008, a front-side dielectric layer may be formed by depositing a layer of dielectric material on the first surface of the piezoelectric plate. The dielectric layer may be deposited using a conventional deposition technique such as sputtering, evaporation, or chemical vapor deposition. The dielectric layer may be deposited over a portion of the substrate, not including the IDT fingers. The front-side dielectric layer can correspond to a dielectric coating 713 as described above. In an alternative aspect, a dielectric coating 716 can be deposited on a back-side of the diaphragm as also described above.

In either event, at 1010, a passivation layer may optionally be applied over the exposed IDT fingers to shield and protect the material in an exemplary aspect.

Thus, according to the manufacturing steps at 1008 and 1010 after the application of the layers in is complete, the filter device may be completed at step 1012. Moreover, actions that may occur to complete the filter device may include depositing and patterning additional metal layers to form conductors other than the IDT conductor pattern; proceeding with other metal and oxide processing steps to complete resonator fabrication; depositing an encapsulation/passivation layer such as SiO2 or Si3O4 over all or a portion of the device; forming bonding pads or solder bumps or other means for making connection between the device and external circuitry; excising individual devices from a wafer containing multiple devices; other packaging steps; and testing.

As described above, by not applying a dielectric layer covering the IDT fingers on the substrate, or rather applying a dielectric layer between the IDT fingers, produces a more consistent and repeatable result for the XBAR device. Specifically, the acoustic resonator device and a method for manufacturing the same described above make it unnecessary to apply dielectric layers to different resonators to vary the respective thicknesses, which thereby changes the resonance frequency. Rather, by changing a single resonator characteristic, for example, the p dimension, the resonance frequency of each resonator of the filter device may be adjusted. Specifically, by implementing an adjustment to the p dimension between different resonators, thereby adjusting the resonance frequency, reduces the processing cost and complexity of the manufacturing process and simplifies the resulting structure of the filter device by minimizing the number of dielectric layers that would otherwise be needed to vary the resonant frequency of each resonator.

The aspects described herein additionally include one or more of the following implementation examples described in the following numbered clauses.

In general, it is noted that throughout this description, the embodiments and examples shown should be considered as exemplars, rather than limitations on the apparatus and procedures disclosed or claimed. Although many of the examples presented herein involve specific combinations of method acts or system elements, it should be understood that those acts and those elements may be combined in other ways to accomplish the same objectives. With regard to flowcharts, additional and fewer steps may be taken, and the steps as shown may be combined or further refined to achieve the methods described herein. Acts, elements and features discussed only in connection with one embodiment are not intended to be excluded from a similar role in other embodiments.

As used herein, the pair of terms "top" and "bottom" can be interchanged with the pair "front" and "back". As used herein, "plurality" means two or more. As used herein, a "set" of items may include one or more of such items. As used herein, whether in the written description or the claims, the terms "comprising", "including", "carrying", "having", "containing", "involving", and the like are to be understood to be open-ended, i.e., to mean including but not limited to. Only the transitional phrases "consisting of" and "consisting essentially of", respectively, are closed or semi-closed transitional phrases with respect to claims. Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements. As used herein, "and/or" means that the listed items are alternatives, but the alternatives also include any combination of the listed items.

What is claimed:

1. A filter device comprising:
   a substrate having a surface;
   at least one piezoelectric layer supported by the substrate;
   a plurality of interdigital transducers (IDTs) of a plurality of resonators that each have a plurality of interleaved fingers at respective diaphragms of the at least one piezoelectric layer disposed over one or more cavities, wherein the at least one piezoelectric layer has a first surface facing away from the one or more cavities and a second surface facing the one or more cavities, and the plurality of IDTs are disposed on the second surface of the at least one piezoelectric layer facing the one or more cavities; and
   a dielectric layer on the diaphragms at the first surface of the at least one piezoelectric layer,
   wherein no dielectric layer exists at the second surface of the at least one piezoelectric layer where the plurality of interleaved fingers of the plurality of IDTs are disposed,
   wherein a first resonator of the plurality of resonators includes a first plurality of interleaved fingers having a first pitch,
   wherein a second resonator of the plurality of resonators includes a second plurality of interleaved fingers having a second pitch that is different than the first pitch.

2. The filter device of claim 1, wherein the first pitch is less than the second pitch, such that the first resonator has a higher resonance frequency than the second resonator.

3. The filter device of claim 1, wherein the first resonator and the second resonator comprise a series resonator and a shunt resonator, respectively.

4. The filter device of claim 1, wherein the respective IDTs of the first resonator and the second resonator are configured to excite shear bulk acoustic waves in the at least one piezoelectric layer in response to respective radio frequency signals applied to each IDT.

5. The filter device of claim 1, further comprising a passivation layer directly on the plurality of IDTs of a plurality of resonators.

6. The filter device of claim 1, wherein the first pitch is a first center-to-center spacing between adjacent interleaved fingers of the first plurality of interleaved fingers, and the second pitch is a second center-to-center spacing between adjacent interleaved fingers of the second plurality of interleaved fingers.

7. The filter device of claim 6, wherein the first center-to-center spacing is constant over a length of the respective IDT of the first resonator.

8. The filter device of claim 7, wherein the second center-to-center spacing varies over a length of the respective IDT of the second resonator.

9. The filter device of claim 6, wherein the first center-to-center spacing varies over a length of the respective IDT of the first resonator.

10. The filter device of claim 1, wherein the one or more cavities extend into the surface of the substrate.

11. The filter device of claim 10, wherein the substrate comprises a base and an intermediate layer that is a dielectric material and the one or more cavities extend into the intermediate layer.

12. A filter device comprising:
   a substrate having a surface;
   at least one piezoelectric layer supported by the substrate;
   a plurality of interdigital transducers (IDTs) of a plurality of resonators, which include a series resonator and a shunt resonator, with the plurality of IDTs each having a plurality of interleaved fingers at respective diaphragms of the at least one piezoelectric layer disposed over one or more cavities, wherein the at least one piezoelectric layer has a first surface facing away from the one or more cavities and a second surface facing the one or more cavities, and the plurality of IDTs are disposed on the second surface of the at least one piezoelectric layer facing the one or more cavities; and
   a dielectric layer on the diaphragms at the first surface of the at least one piezoelectric layer, wherein no dielectric layer exists at the second surface of the at least one piezoelectric layer where the plurality of interleaved fingers of the plurality of IDTs are disposed,
   wherein the series resonator includes a first plurality of interleaved fingers having a first pitch that is a first center-to-center spacing between adjacent interleaved fingers of the first plurality of interleaved fingers,
   wherein the shunt resonator includes a second plurality of interleaved fingers having a second pitch that is a second center-to-center spacing between adjacent interleaved fingers of the second plurality of interleaved fingers, and
   wherein the first pitch is different than the second pitch.

13. The filter device of claim 12, wherein the respective IDTs of the plurality of resonators are each configured to excite shear bulk acoustic waves in the at least one piezoelectric plate in response to respective radio frequency signals applied to each IDT.

14. The filter device of claim 12, wherein the first center-to-center spacing is constant over a length of the respective IDT of the series resonator.

15. The filter device of claim 12, wherein the first pitch is less than the second pitch, such that the series resonator has a higher resonance frequency that the shunt resonator.

16. The filter device of claim 12,
wherein the one or more cavities extend into the surface of the substrate, and
wherein the substrate comprises a base and an intermediate layer that is a dielectric material and the one or more cavities extend into the intermediate layer.

* * * * *